(12) United States Patent
Kosar

(10) Patent No.: US 11,573,034 B2
(45) Date of Patent: Feb. 7, 2023

(54) ENERGY HARVESTING DEVICE

(71) Applicant: SABANCI ÜNIVERSITESI, Istanbul (FR)

(72) Inventor: Ali Kosar, Istanbul (FR)

(73) Assignee: SABANCI ÜNIVERSITESI, Istanbul (TR)

( * ) Notice: Subject to any disclaimer, the term of this patent is extended or adjusted under 35 U.S.C. 154(b) by 880 days.

(21) Appl. No.: 16/322,930

(22) PCT Filed: Aug. 9, 2016

(86) PCT No.: PCT/TR2016/050281
§ 371 (c)(1),
(2) Date: Feb. 2, 2019

(87) PCT Pub. No.: WO2018/030967
PCT Pub. Date: Feb. 15, 2018

(65) Prior Publication Data
US 2020/0182514 A1    Jun. 11, 2020

(51) Int. Cl.
*F24V 40/10* (2018.01)
*H02S 10/30* (2014.01)
*H01L 35/30* (2006.01)
*H01L 35/32* (2006.01)
*H01L 35/22* (2006.01)

(52) U.S. Cl.
CPC ............ *F24V 40/10* (2018.05); *H01L 35/30* (2013.01); *H01L 35/32* (2013.01); *H02S 10/30* (2014.12); *H01L 35/22* (2013.01)

(58) Field of Classification Search
CPC .......... F24V 40/10; H02S 10/30; H01L 35/30; H01L 35/32; H01L 35/22; H01L 35/02; B60H 1/02; F01P 11/028; F02F 7/0073
USPC ......................................................... 126/247
See application file for complete search history.

(56) References Cited

U.S. PATENT DOCUMENTS

| | | | |
|---|---|---|---|
| 4,344,567 A * | 8/1982 | Horne | F24D 7/00 122/26 |
| 5,226,408 A | 7/1993 | Drysdale | |
| 5,226,488 A | 7/1993 | Lessard et al. | |
| 5,490,874 A * | 2/1996 | Kuster | B01D 19/0057 96/204 |
| 5,526,408 A | 6/1996 | Yekutiely | |

(Continued)

FOREIGN PATENT DOCUMENTS

| | | |
|---|---|---|
| CN | 2930573 Y | 8/2007 |
| EP | 1706679 A1 | 10/2006 |

(Continued)

*Primary Examiner* — Steven B McAllister
*Assistant Examiner* — Daniel E. Namay
(74) *Attorney, Agent, or Firm* — Bayramoglu Law Offices LLC

(57) ABSTRACT

A device including a liquid's flow path having an upstream side and a downstream side, a plurality of flow restrictive elements providing material communication between the upstream side to the downstream side, a thermoelectric generator or a thermophotovoltaic cell in thermal connection with a portion of the device located at the downstream side with respect to the plurality of flow restrictive elements. The portion is provided with roughness elements for, in use, contacting a fluid flowing through the device and facilitating collapse of cavitation bubbles.

19 Claims, 3 Drawing Sheets

(56) References Cited

U.S. PATENT DOCUMENTS

| | | | | |
|---|---|---|---|---|
| 5,957,122 | A * | 9/1999 | Griggs | B01F 27/2722 |
| | | | | 122/26 |
| 8,365,540 | B2 * | 2/2013 | Harman | F28D 21/00 |
| | | | | 239/589 |
| 10,290,794 | B2 * | 5/2019 | Kasichainula | H02S 40/44 |
| 10,431,726 | B2 * | 10/2019 | Ozturk | H01L 35/30 |
| 2002/0009015 | A1 | 1/2002 | Laugharn et al. | |
| 2006/0034705 | A1 | 2/2006 | Tessien et al. | |
| 2006/0137663 | A1 * | 6/2006 | Vaught | B01D 19/0042 |
| | | | | 96/220 |
| 2006/0159561 | A1 | 7/2006 | Tessien | |
| 2011/0139203 | A1 | 6/2011 | Yap | |
| 2011/0139405 | A1 | 6/2011 | Harman et al. | |
| 2012/0186672 | A1 | 7/2012 | Fisenko et al. | |
| 2015/0176836 | A1 * | 6/2015 | Griggs | F22B 3/06 |
| | | | | 202/175 |
| 2016/0054031 | A1 * | 2/2016 | Echart | F24V 40/00 |
| | | | | 126/247 |

FOREIGN PATENT DOCUMENTS

| | | | | |
|---|---|---|---|---|
| JP | 2011109891 | A | 6/2011 | |
| WO | 9516995 | A1 | 6/1995 | |
| WO | 2008108596 | A1 | 9/2008 | |
| WO | WO-2008108596 | A1 * | 9/2008 | F24V 40/10 |

* cited by examiner

ENERGY HARVESTING DEVICE

CROSS REFERENCE TO THE RELATED APPLICATIONS

This application is the national phase entry of International Application PCT/TR2016/050281, filed on Aug. 9, 2016, the entire content of which is incorporated herein by reference.

TECHNICAL FIELD

The present invention relates to an energy harvesting device based on cavitation and heat generation through collapsing cavitating bubbles.

BACKGROUND

Batteries have always been the primary source of energy for powering many electronic appliances in households and offices. To achieve energy savings and clean technologies, energy harvesting from ambient sources such as solar power, mechanical vibrations, and thermal energy should be exploited. This approach is needed to offer solutions for solving individual increasing energy consumption problem in the world using renewable energy resources. Thus, energy harvesting is becoming more and more attractive in a wide variety of self-powered micro devices or systems including sensors, monitoring devices, biomedical devices, and implantable biodevices. The market size of energy harvesting is projected to increase to $4.2 billion in 2019 [Energy Harvesters: Market Shares, Strategies, and Forecasts, Worldwide, 2013 to 2019 (2013) Winter Green Research Code: MRS—872]. This huge budget is mostly based on demand for power generation in small scale and should be wisely managed in order to meet global energy need.

Piezoelectric, thermoelectric and pyroelectric energy harvesting, and microengines mostly involve expensive materials and moving parts.

The patent documents WO 95/16995 A1, CN 2 930 573 Y, US 2011/139405 A1, US 2012/186672 A1, U.S. Pat. No. 5,526,408 A, EP 1 706 679 A1, US 2006/159561 A1, US 2006/034705 A1, US 2011/139203 A1, US 2002/009015 A1, WO 2008/108596 A1, are related to cavitation-related technologies or systems which can be arranged for provision of cavitation bubbles. Yet, the combinations of the teachings in said documents provide only a limited efficiency in energy harvesting from flowing fluids.

SUMMARY

A primary object of the present invention is to overcome the abovementioned shortcomings of the prior art.

Another object of the present invention is provision of a device and method for sustainable energy generation with low investment and operational costs.

The present invention proposes a device comprising a liquid's flow path having an upstream side and a downstream side, a plurality of flow restrictive elements providing material communication between the upstream side and the downstream side. Accordingly, the present invention further proposes an energy harvesting method from liquid streams.

BRIEF DESCRIPTION OF THE DRAWINGS

The figures, whose brief explanation is herewith provided, are solely intended for providing a better understanding of the present invention and are as such not intended to define the scope of protection or the context in which said scope is to be interpreted in the absence of the description.

DETAILED DESCRIPTION OF THE EMBODIMENTS

Figure 1A:
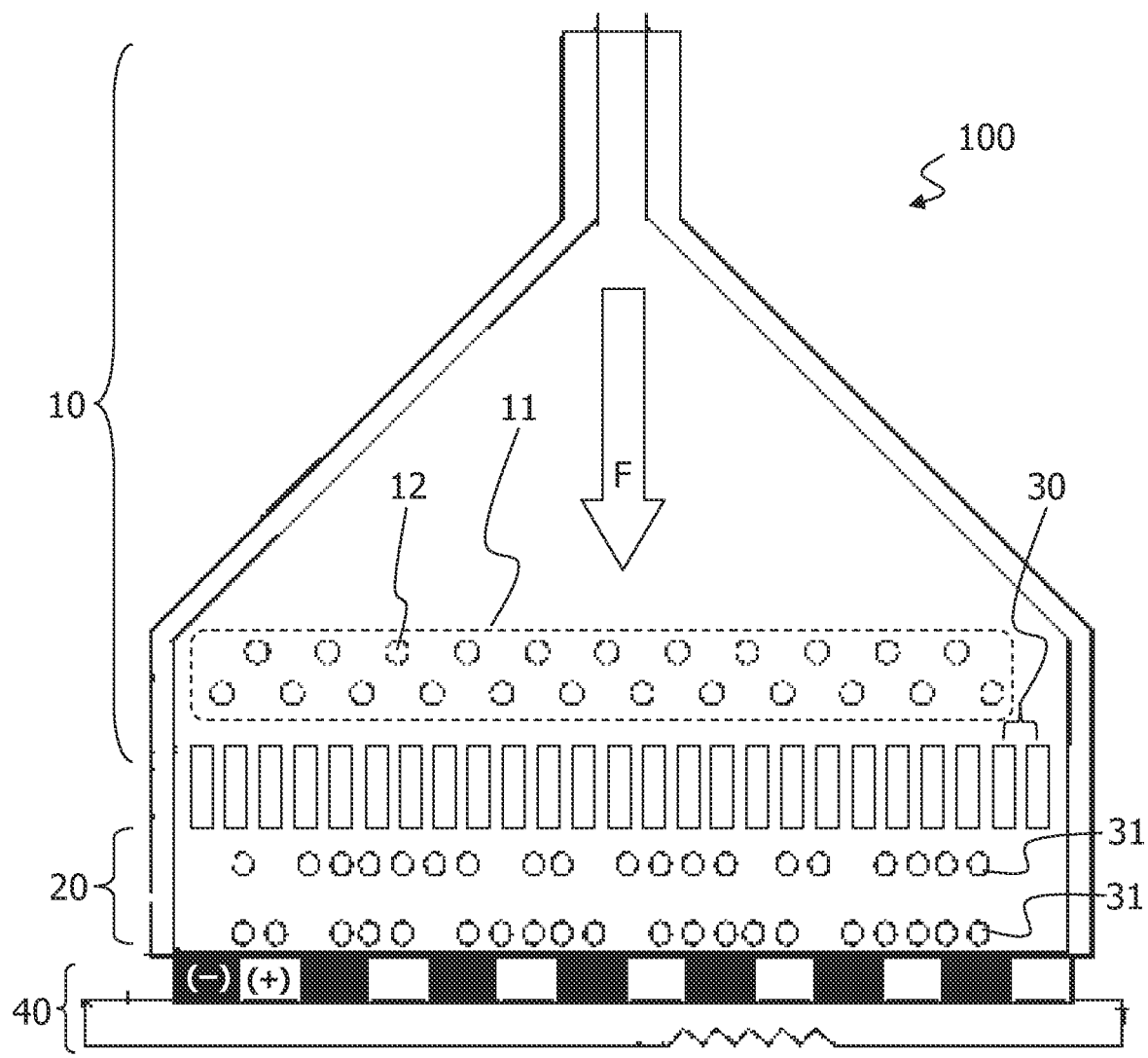
FIG. 1A shows schematic illustrations of an embodiment of the device according to the present invention.

Referring now the figures outlined before, the present invention proposes a device (100) comprising a liquid's flow path having an upstream side (10) and a downstream side (20), a plurality of flow restrictive elements (30) providing material communication between the upstream side and the downstream side.

In a preferred embodiment, the device further comprises a thermoelectric generator (40) or a (micro-) thermophotovoltaic cell (50) in thermal connection with a portion (21) of the device located at the downstream side with respect to the flow restrictive elements.

Thermoelectric generators have two sides, namely a hot side and a cold side. The hot side (41) of a thermoelectric generator to be employed in the device according to the present invention is the side in thermal connection with the downstream side of the device, where, in use, cavitation bubbles collapse and generate heat. The cold side (42) of the thermoelectric generator is in thermal contact with a colder medium, e.g. surrounding air or a fluid stream to be directed towards the upstream side. The temperature difference between two sides is correlated with the amount of electric energy generated through the thermoelectric generator. Accordingly, in order to keep the cold side of the thermoelectric generator, the cold side may preferably be provided with a heat sink (not shown) in order to enhance heat removal from the cold side.

In a preferred embodiment of the device, said portion (21) is provided with roughness elements (22), in use, contacting a fluid flowing through the device facilitating collapse of any cavitation bubbles.

Said portion (21) may preferably be in form of a plate made of a metallic material or of silicon, comprising roughness elements (22) on one side thereof.

Fluid contact surfaces of the flow restrictive elements are preferably at least partly coated with a material different than that of the flow restrictive elements, such that the hydrophilicity of said surfaces are different near two distal ends of each flow restrictive element in accordance with the fluid flow direction (F). Preferably, the fluid inlet (upstream side distal end) of a flow restrictive element is the most hydrophobic location, while the outlet (i.e. downstream side distal end) corresponds to the most hydrophilic location.

The flow restrictive elements may be in form of venturi or orifice, having lengths along fluid flow direction within a range between 1 micrometer and 10000 micrometers; and having a mean value for their hydraulic diameters ranging between 100 nanometers and 250 micrometers.

Preferably, at least a part of the roughness elements are located at a distance from downstream side opening of at least a flow restrictive element, such that the ratio of said distance to the mean value of hydraulic diameters of flow restrictive elements is within a range between 10 and 1000.

The device preferably comprises a flow aligner section (11) including a plurality of flow aligners (12) located at the upstream side, in form of protrusions mainly perpendicular to the fluid flow direction.

The device can be adaptable (or adapted) to a tap (not shown) for harvesting energy from e.g. flowing water. Alternatively, a tap (not shown) provided with the device according to the present invention can be considered as replacement or alternative of a tap for additional energy harvesting function. Accordingly, the present invention further proposes a tap provided with the device.

The present invention further proposes a method for energy harvesting from flowing liquid streams. The method comprises the following steps;
passing the liquid through at least one flow restrictive element, such that cavitation bubbles arise in the liquid upon passing the flow restrictive element,
letting the cavitation bubbles collapse,
harvesting the heat generated around collapsing bubbles.

Said harvesting may be considered as heating of the liquid by heat generation around collapsing bubbles. Yet, the thermal energy generated around the collapsing bubbles can also be utilized for electric energy generation as an energy harvesting fashion. To this end, the method preferably comprises that the collapse of the cavitation bubbles occurs near a surface in thermal connection with a thermoelectric generator or a thermophotovoltaic cell.

EXAMPLE

Schematic view of an exemplary energy harvesting device is shown in FIG. 1. A liquid can be guided to a plurality of micro scale flow restrictive elements with preferably functional (i.e. variable hydrophilicity) surfaces, the flow restrictive elements being arranged mainly parallel to each other.

In this case, the surfaces are prepared in such a way that the wettability varies along the flow restrictive element. Accordingly, the fluid inlet of a flow restrictive element (inlet) is the most hydrophobic location, while the fluid outlet of the flow restrictive element (outlet) corresponds to the most hydrophilic location. Thus, cavitation would incept toward the inlet of the flow restrictive element due to potential low pressure zones and more pronounced surface effects in small scale as well as more hydrophobic behavior, which promotes bubble nucleation. As a result, surface nuclei would be the key parameter for the inception of hydrodynamic cavitation. The conditions for obtaining cavitation in a fluid stream can be predicted using related knowledge on fluids dynamics and physical chemistry.

The existence of wettability gradient (i.e. variable hydrophilicity) mitigates bubble motion near the surface thereby enhancing transport of bubbles to the downstream distal end of the flow restrictive element. Thus, cavitation bubbles head towards the downstream side, and preferably are targeted to the downstream side of the device, preferably to a plate with a surface having roughness elements which can be out-of-plane protrusions in form of micro pillars, or a rough surface with indentations. The bubbles either collapse near the surface due to the pressure recovery or blast due to collision with the roughness elements and micro pillars, which releases energy and causes a rise in the temperature. Since many flow restrictive elements exist and bubble release is expected from each element due to functional surfaces, the rise in the temperature on the surface will be uniform. As a result, the downstream side (or preferably the plate located there) will act as the heat source for a thermoelectric generator. The temperature difference between the plate and cold side of the thermoelectric generator causes generation of electrical power. The amount of power in such case can easily meet personal energy need. Necessary power for daily devices such as cell phones, laptops, and devices in offices could be provided using this approach. The only required input is a simple flow of a fluid, which could be well provided from a tap in a household. Thus in such scale, this approach has the potential for solving personal energy needs in a cheap and environmentally friendly fashion and can trigger a paradigm shift in energy harvesting.

The proposed device can be connected to a water supply, which could be a pressurized tank as well as a tap in a household via appropriate fittings. Also, the device can be provided in form of taps each being adaptable to a certain size of standard tubing for connecting to the main water system. The flow rate can be controlled by a fine control valve and measured with sensitive commercial flow meters capable of measuring low flow rates as well as intermediate flow rates. Upstream side of the device (even when it includes an inlet section and a flow aligner section) can be fabricated with standard IC fabrication methods (e.g. lithography, sputtering, deep reactive ion etching), micromachining and laser machining tools. The flow aligner section serves for an enhanced homogeneity in flow rate distribution to each flow restrictive element. The plate with small flow restrictive elements such as venturis and orifices (hydraulic diameters of 100 nm-250 µm) (lengths of 1-10000 µm) can be fabricated using the same microfabrication techniques as the inlet and flow aligner section. For the fabrication of the flow restrictive elements, E-Beam Lithography and Focused Ion Beam methods can be implemented.

Surfaces of flow restrictive elements to be contacted with fluid can be prepared with deposition methods such as the iCVD method. The surfaces can be modified in such a way that the wettability changes along the flow restrictive element. These functional surfaces mitigate both nucleation from the surface and motion of the formed bubbles to the exit thereby ensuring cavitating flows in each flow restrictive element and intensifying cavitation.

The fluid stream is guided through the flow restrictive elements so that local static pressure of the fluid inside flow restrictive elements decreases in consistency with the Bernoulli equation and there will be a local minimum pressure due to the Vena Contracta effect. If the pressure decreases to a certain critical value under appropriate conditions, phase change takes place and bubbles form inside each flow restrictive element due to the inception of cavitation and move toward the exit upon passing through the downstream side, with the help of the (functionalized) surfaces of flow restrictive elements.

The emerging bubbles are targeted to the downstream side (preferably provided with a metallic plate or a plate made of Silicon) at different distances from the fluid releasing distal ends of the flow restrictive elements. Preferably, here, the distance to hydraulic diameter ratio is within a range between 10 and 1000. One side of the thin plate preferably has micro roughness elements and micro pillars, which will serve for enhanced blasting of incoming bubbles. Sanding, chemical vapor deposition and deep reactive ion etching methods can be implemented for the introduction of micro roughness elements and micro pillars.

Erosion on the thin plate due to bubble collapse seems at the first glance to badly influence energy harvesting. However, roughness elements and micro pillars will be first exposed to bubble collapse so that pits and sharp locations could form on the surfaces, which will further facilitate bubble blasting on the surface and contribute to temperature rise.

The thin plate to be exposed to small bubbles is used as the heat source and is joined to the generators via bonding or high quality thermal grease. Daily used electronic appliances can be powered using the experimental setup.

Figure 1B:
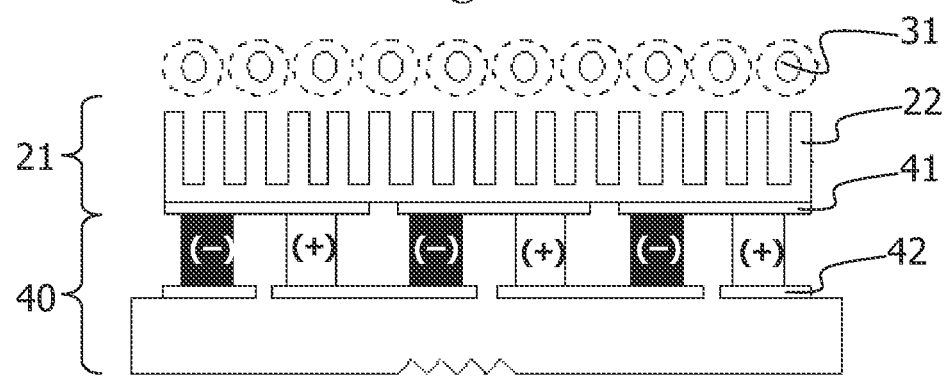
FIG. 1B shows schematic illustrations of energy harvesting by a thermoelectric generator from heat generated around collapsing bubbles at the downstream side of the device.
Figure 2A:
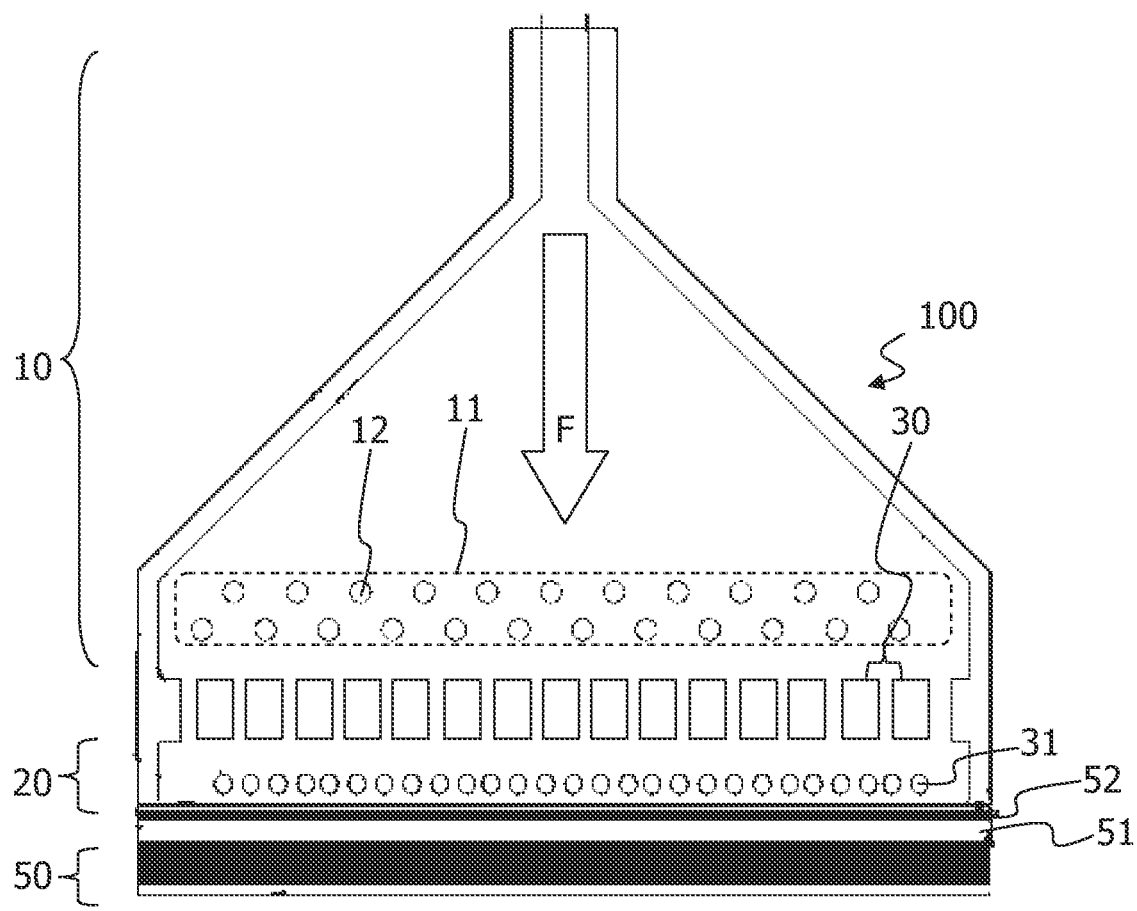
FIG. 2A shows schematic illustrations of another embodiment of the device according to the present invention.
Figure 2B:
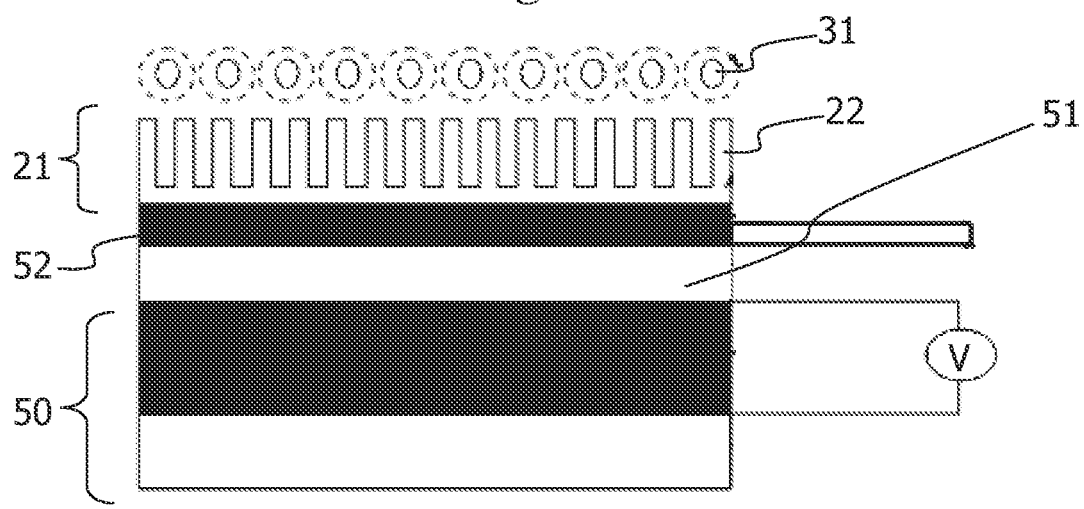
FIG. 2B shows schematic illustrations of energy harvesting by a thermophotovoltaic (TPV) cell from heat generated around collapsing bubbles at the downstream side of the device.

(Micro-) thermophotovoltaic cell can be developed using standard IC microfabrication techniques. For this, the downstream side (preferably the plate) can be used as the heat source. The emitter (52) of the thermophotovoltaic cell (50) may be deposited (using low-pressure and plasma-enhanced chemical vapor deposition) on the back surface of the thin plate and can be for example polycrystalline Si and $SiO_2$ structure. This combined structure can be fitted to a commercially available stepper motor and piezo controlled micromanipulator assembly so that the vacuum gap (51) between the emitter (52) and the thermophotovoltaic cell (50) can be fine controlled with a resolution below 1 μm (FIG. 1A and FIG. 1B). Commercial miniature photovoltaic cells are already available in the microelectronics market and can be utilized in the proposed concept.

The photovoltaic cell can be bonded to an available thermal management system, which can be based on microchannel cooling. The fluid passing through the system can be recycled and directed to this thermal management system. An anomalous increase in radiative transfer between surfaces at small separation is expected to occur, which potentially increases the performance of thermophotovoltaic cells. Surface phonon polaritons related to thermal vibration of lattices (transverse optical phonons) may improve the radiative energy transfer between two surfaces at small gaps. These phenomena can be also exploited to enhance the performance and efforts can be made to attain the smallest possible vacuum gap between the emitter and thermophotovoltaic cell.

The proposed technique does not require any external power and moving parts in contrast to common energy-harvesting devices, such as the ones involving piezoelectric material and microengines. It has the potential for providing high power density and the necessary power to run many daily used electronic devices and fulfilling personal energy demands in daily life; in addition to heating of fluids.

In the proposed technique, high temperatures on the surfaces near collapsing small bubbles are exploited in energy harvesting in small scale so that miniature cheap and environmentally friendly energy-harvesting devices (with a price of only few hundred Euros) can be developed. Necessary power for daily devices such as cell phones, laptops, and devices in offices could be provided using this novel approach. The only required input is a simple flow of a fluid, which could be well provided from a tap in a household. Thus, this approach has the potential for solving personal energy needs in a cheap and environmentally friendly fashion and can trigger a paradigm shift in energy harvesting.

Figure 3:
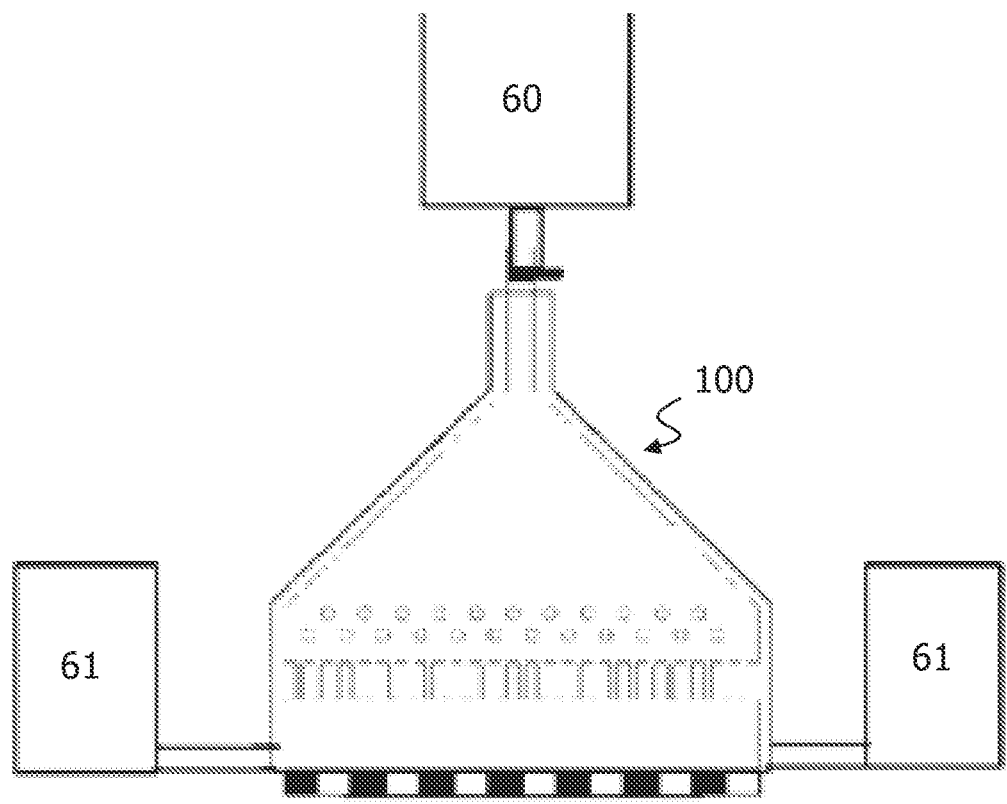
FIG. 3 shows an exemplary fashion of use of the device according to the present invention, where a liquid stream passing through the device can be directed to target tanks, which can thus be filled with heated liquid.

As illustrated in the FIG. 3, the use of the device according to the present invention can be directing a liquid stream from a supply tank (60) passing through the device (100) to one or more target tank(s) (61), which can thus be filled with heated liquid.

The proposed concept could find applications in underwater usages requiring electricity, such as wildlife observation and military and security applications. In such applications, the aim is to generate power on the locations, which are not easily accessible because of depth, flow and unreachable coordinates. Besides, the output power from the proposed approach could be utilized as a power source for both lighting and GPS location devices installed on buoys in open sea.

REFERENCE NUMERALS RELATED FEATURES

10 Upstream side
11 Flow aligner section
12 Flow aligner
20 Downstream side
21 Portion
22 Roughness element
30 Flow restrictive element
31 Collapsing bubble
40 Thermoelectric generator
41 Hot side (of the thermoelectric generator)
42 Cold side (of the thermoelectric generator)
50 Thermophotovoltaic cell
51 Vacuum gap
52 Emitter
60, 61 Supply tank and vacuum tank, respectively
100 Device according to the present invention Thus the following objects are achieved by the present invention;
  overcoming the abovementioned shortcomings of the prior art,
  provision of a device and method for sustainable energy generation with low investment and operational costs.

What is claimed is:

1. A device comprising:
  a liquid's flow path having an upstream side and a downstream side allowing a liquid flow from the upstream side to the downstream side;
  a plurality of flow aligners located at the upstream side, wherein said plurality of flow aligners are formed of protrusions perpendicular to the liquid flow direction;
  a plurality of flow restrictive elements providing material communications between the upstream side and the downstream side; and
  a thermoelectric generator or a thermophotovoltaic cell in thermal connection with a portion of the device located at the downstream side with respect to the plurality of flow restrictive elements;
  wherein the plurality of flow restrictive elements are parallel to each other;
  the plurality of flow aligners guide the liquid flow through gaps between the plurality of flow restrictive elements;
  the local static pressure of the liquid in the gaps between the plurality of flow restrictive elements decreases in consistency with a Bernoulli equation; and
  the portion is provided with roughness elements for, in use, contacting a fluid flowing through the device and facilitating collapse of cavitation bubbles.

2. The device according to the claim 1, wherein fluid contact surfaces of the plurality of flow restrictive elements are at least partly coated with a material different than that of the flow restrictive elements, such that the hydrophilicity of the fluid contact surfaces are different near two distal ends of each flow restrictive element in accordance with a fluid flow direction.

3. The device according to the claim 2, wherein an upstream side distal end of one or more of the plurality of flow restrictive elements is more hydrophobic relative to a downstream side distal end of the one or more of the plurality of flow restrictive elements.

4. The device according to claim 3, wherein the portion is in form of a plate made of a metallic material or of silicon, comprising the roughness elements on one side thereof.

5. The device according to claim 3, wherein the flow restrictive elements are in form of venturi or orifice, having lengths along the fluid flow direction within a range between 1 micrometer and 10000 micrometers; and having hydraulic diameters with a mean value ranging between 100 nanometers and 250 micrometers.

6. The device according to claim 2, wherein the portion is in form of a plate made of a metallic material or of silicon, comprising the roughness elements on one side thereof.

7. The device according to claim 2, wherein the flow restrictive elements are in form of venturi or orifice, having lengths along the fluid flow direction within a range between 1 micrometer and 10000 micrometers; and having hydraulic diameters with a mean value ranging between 100 nanometers and 250 micrometers.

8. The device according to claim 1, wherein the portion is in form of a plate made of a metallic material or of silicon, comprising the roughness elements on one side thereof.

9. The device according to claim 8, wherein the flow restrictive elements are in form of venturi or orifice, having lengths along the fluid flow direction within a range between 1 micrometer and 10000 micrometers; and having hydraulic diameters with a mean value ranging between 100 nanometers and 250 micrometers.

10. The device according to claim 1, wherein the flow restrictive elements are in form of venturi or orifice, having lengths along the fluid flow direction within a range between 1 micrometer and 10000 micrometers; and having hydraulic diameters with a mean value ranging between 100 nanometers and 250 micrometers.

11. The device according to the claim 10, wherein at least a part of the roughness elements is located at a distance from downstream side opening of the plurality of flow restrictive elements, such that a ratio of the distance to the mean value of hydraulic diameters of flow restrictive elements is within a range of 10 and 1000.

12. The device according to claim 1, further comprising a thermoelectric generator having a cold side provided with a heat sink.

13. A tap comprising the device according to claim 1, wherein the tap comprises a water supply, and wherein the device is connected to the tap via fittings.

14. The device according to the claim 13, wherein fluid contact surfaces of the plurality of flow restrictive elements are at least partly coated with a material different than that of the flow restrictive elements, such that the hydrophilicity of the fluid contact surfaces are different near two distal ends of each flow restrictive element in accordance with a fluid flow direction.

15. The tap according to the claim 14, wherein an upstream side distal end of one or more of the plurality of flow restrictive elements is more hydrophobic relative to a downstream side distal end of the one or more of the plurality of flow restrictive elements.

16. The tap according to claim 15, wherein the portion is in form of a plate made of a metallic material or of silicon, comprising the roughness elements on one side thereof.

17. The tap according to claim 16, wherein the flow restrictive elements are in form of venturi or orifice, having lengths along the fluid flow direction within a range between 1 micrometer and 10000 micrometers; and having hydraulic diameters with a mean value ranging between 100 nanometers and 250 micrometers.

18. The tap according to the claim 17, wherein at least a part of the roughness elements are located at a distance from downstream side opening of the plurality of flow restrictive elements, such that a ratio of the distance to the mean value of hydraulic diameters of flow restrictive elements is within a range of 10 and 1000.

19. A method for energy harvesting from flowing liquid streams, the method comprising:

passing the liquid through a plurality of flow aligners of a device, wherein said plurality of the flow aligners are formed of protrusions perpendicular to a flow direction of the liquid, passing the liquid through a plurality of flow restrictive elements of the device, in such conditions where cavitation bubbles arise in the liquid upon passing through the plurality of flow restrictive elements, wherein the plurality of flow restrictive element are parallel to each other, the plurality of flow aligners guide the liquid through gaps between the plurality of flow restrictive elements, and the local static pressure of the liquid in the gaps between the plurality of flow restrictive elements decreases in consistency with a Bernoulli equation; and letting the cavitation bubbles collapse at a portion of the device located at a downstream side with respect to the flow restrictive elements, by roughness elements provided on the portion for contacting the liquid flowing through the device and facilitating the collapse, harvesting heat generated around collapsing bubbles with a thermoelectric generator or a thermophotovoltaic cell in thermal connection with the portion.

\* \* \* \* \*